United States Patent
Tang et al.

(10) Patent No.: US 10,916,732 B2
(45) Date of Patent: Feb. 9, 2021

(54) DISPLAY PANEL

(71) Applicant: WUHAN CHINA STAR OPTOELECTRONICS TECHNOLOGY CO., LTD., Wuhan (CN)

(72) Inventors: Yuejun Tang, Wuhan (CN); Xueyun Li, Wuhan (CN)

(*) Notice: Subject to any disclaimer, the term of this patent is extended or adjusted under 35 U.S.C. 154(b) by 0 days.

(21) Appl. No.: 16/466,305

(22) PCT Filed: Jan. 4, 2019

(86) PCT No.: PCT/CN2019/070472
§ 371 (c)(1),
(2) Date: Jun. 4, 2019

(87) PCT Pub. No.: WO2020/118813
PCT Pub. Date: Jun. 18, 2020

(65) Prior Publication Data
US 2020/0227688 A1   Jul. 16, 2020

(51) Int. Cl.
| H01L 27/00 | (2006.01) |
| H01L 51/00 | (2006.01) |
| H01L 51/52 | (2006.01) |
| H01L 27/32 | (2006.01) |

(52) U.S. Cl.
CPC ...... H01L 51/5284 (2013.01); H01L 27/3244 (2013.01); H01L 51/5253 (2013.01)

(58) Field of Classification Search
CPC .......... H01L 27/3244; H01L 27/1247; H01L 27/3276; H01L 27/0203; H01L 51/5284; H01L 51/5253; H01L 51/56; H01L 51/5246; H01L 51/5281
See application file for complete search history.

(56) References Cited

U.S. PATENT DOCUMENTS

| 9,972,809 B2* | 5/2018 | Chu ..................... H01L 51/5284 |
| 10,008,691 B2* | 6/2018 | Fujino ................. H01L 51/5246 |
| 2007/0184365 A1* | 8/2007 | Kim ..................... H01L 51/0004 430/7 |
| 2014/0014960 A1 | 1/2014 | Yamazaki et al. |
| 2015/0280154 A1 | 10/2015 | Jang et al. |
| 2016/0049443 A1 | 2/2016 | Kim et al. |
| 2017/0062772 A1 | 3/2017 | Chu et al. |
| 2017/0077441 A1* | 3/2017 | Fujino ................. H01L 51/5246 |
| 2019/0058153 A1* | 2/2019 | Luo ....................... H01L 27/322 |
| 2019/0097179 A1 | 3/2019 | Shu et al. |

FOREIGN PATENT DOCUMENTS

| CN | 105070741 A | 11/2015 |
| CN | 105575998 A | 5/2016 |
| CN | 107516664 A | 12/2017 |
| CN | 108565280 A | 9/2018 |

* cited by examiner

*Primary Examiner* — Nikolay K Yushin (57) ABSTRACT

A display panel is provided and includes a display region including a plurality of sub pixel regions arranged in an array, wherein each of the sub pixel regions comprises a light emitting region and a non-light emitting region; a black array layer formed in the non-light emitting regions, the black array is used to shield the metal layer to reflect and absorb the environment light, to improve a light output rate and to improve a contrast ratio of the display device.

9 Claims, 5 Drawing Sheets

DISPLAY PANEL

BACKGROUND OF INVENTION

This application claims the priority of International Application No. PCT/CN2019/070472, filed on 2019 Jan. 4, which claims priority to Chinese Application No. 201811516758.5, filed on 2018 Dec. 12. The entire disclosures of each of the above applications are incorporated herein by reference.

CROSS REFERENCE TO RELATED APPLICATION

Field of Invention

The present application relates to displays, and particularly to a display panel.

Description of Prior Art

Currently, organic light-emitting Diode (OLED) displays have attracted attention as a display device for displaying images. OLED displays differ from liquid crystal display (LCD) devices in that they have self-illuminating properties and do not use a separate light source, so they can be manufactured thinner and lighter than display devices with separate light sources, so it is relatively easy to achieve characteristics of flexibility and foldable display. Since an OLED display illuminating device has a multi-layered metal layer structure, the OLED display reflects the ambient light to the human eye to affect the observation of images, the OLED display is provided with an anti-reflection layer structure on a surface of the display, a circular polarizer (polarizer, POL) is usually used to absorb the ambient light reflected by the metal, but the use of the circular POL will make the light extraction efficiency low and to decrease contrast of the OLED display.

SUMMARY OF INVENTION

The application mainly provides a display panel and a display device to solve a problem of metal layers reflecting and absorbing the environment light to decrease a light output rate and to decrease a contrast ratio of the OLED display device of prior art.

For the above-mentioned objective, the present disclosure employs the following technical schemes.

A display panel is provided and includes a display region and a black array layer, wherein a plurality of sub pixel regions are arranged in an array, each of the sub pixel regions includes a light emitting region and a non-light emitting region; the black array layer is formed in the non-light emitting regions.

Further, the display panel further includes an array substrate and a package structure, the sub pixel regions are formed in the array substrate; the package structure is formed on the array substrate; the black array layer is formed in the package structure; and/or on the package structure; and/or between the package structure and the array substrate.

Further, the package structure includes at least one inorganic layer and at least organic layer; the inorganic layer and the organic layer overlap with each other.

Further, when the black array layer is formed in the package structure, in each of the sub pixel regions, the black array layer is formed in at least one inorganic layer and/or in at least one organic layer.

Further, when the black array layer is formed in the organic layer, the organic layer covers the black array layer; or the organic layer includes a plurality of gaps formed therein and corresponding to the light emitting region, the black array layer is filled into the gaps.

Further, the organic layer is placed at one side of the package structure facing the array substrate; the black array layer is formed between the package structure and array substrate.

Further, the inorganic layer is placed at one side of the package structure facing the array substrate; the black array layer is formed between the package structure and array substrate.

Further, the inorganic layer is placed at one side of the package structure defined the farthest from the array substrate, when the black array layer is formed on the package structure, the black array layer is formed on the inorganic layer defined the farthest from the array substrate.

Further, the array substrate includes a thin film transistor structural layer, a plurality of first electrode, a light emitting material layer and a second electrode, the thin film transistor structural layer includes a plurality of thin film transistors, each of the thin film transistors corresponds to one sub pixel region; the first electrodes are correspondingly formed on the thin film transistor structural layer and connected to the thin film transistors, each of the first electrodes corresponds to the light emitting region; the light emitting material layer is correspondingly formed on the first electrodes of the light emitting regions; the second electrode is formed on the light emitting material layer; the package structure is formed on the second electrode.

Further, the first electrodes are anodes, and the second electrode is a cathode.

The beneficial effect of this invention is: the black matrix layer is correspondingly formed in the non-light emitting region, the black array is used to shield the metal layer to reflect and absorb the environment light, to improve a light output rate and to improve a contrast ratio of the display device.

BRIEF DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

The parts of the drawings are identified as follows:
- 100 display region; sub pixel region 10; light emitting region 101; non-light emitting region 102;
- Black matrix layer 1; gap 200;
- Array substrate 2;
- Thin film transistor structural layer 201; substrate 2011; Array layer 2012;
- First electrode 202; light emitting material layer 203; second electrode 204;
- Package structure 3;
- First inorganic layer 3011; second inorganic layer 3012; third inorganic layer 3013;
- First organic layer 3021; second organic layer 3022; third organic layer 3023.

DETAILED DESCRIPTION OF PREFERRED EMBODIMENTS

Technical solutions in embodiments of the present disclosure will be described clearly and completely in combination with reference to the accompanying drawings in the embodiments of the present disclosure. Obviously, the described embodiments are only a part of the embodiments of the present disclosure, rather than all of the embodiments. Based on the embodiments of the present disclosure, all the other embodiments obtained by those skilled in the art without creative efforts shall fall into the protection scope of the present disclosure.

The drawings, which are discussed below, and the various embodiments used to describe the principles of the present disclosure are intended to be illustrative only and not to limit the scope of the disclosure. Those skilled in the art will appreciate that the principles of the present disclosure may be implemented in any suitably arranged system. Exemplary embodiments will be described in detail, examples of which are illustrated in the accompanying drawings. Further, a terminal according to an exemplary embodiment will be described in detail with reference to the accompanying drawings. The same reference numerals in the drawings denote the same elements.

The terms used in the description of the present disclosure are intended to describe the specific embodiments and are not intended to illustrate the concept of the disclosure. Expressions used in the singular encompasses the plural forms of expression unless the context clearly dictates otherwise. In the description of the present disclosure, it is to be understood that the terms such as "comprises", "comprising"," The possibility of one or more other features, numbers, steps, actions, or combinations thereof may be excluded. The same reference numerals in the drawings denote the same parts.

Embodiment 1

Figure 1:
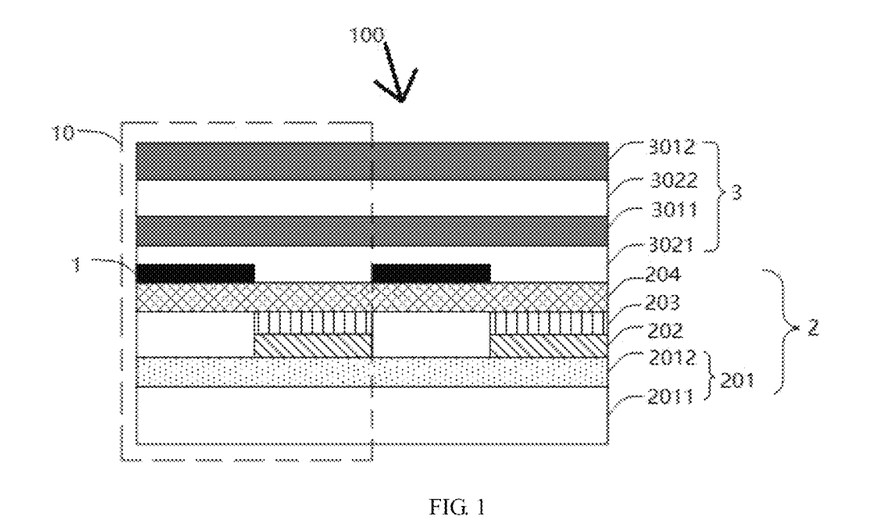
FIG. 1 is a structural view of a black matrix layer formed between a package structure and a second electrode of a first exemplary embodiment according to the present disclosure.

Referring to FIG. 1, this embodiment provides a display panel including a display region 100 and a black matrix layer 1. The display region 100 includes a plurality of sub pixel regions 10 arranged in an array. Each of the sub pixel regions 10 includes a light emitting region 101 (referring to FIG. 10) and a non-light emitting region 102 (referring to FIG. 10). The black matrix layer 1 is correspondingly formed in the non-light emitting regions 101. A projection position of the black matrix layer 1 is placed at the non-light emitting regions 102 or a frame structure outside of the sub pixel regions 10. The black matrix layer 1 can shield the non-light emitting region 102 or a metal layer of the frame structure outside of the sub pixel region 10 to prevent the metal layer from reflecting the ambient light, and can absorb the ambient light to prevent a region shielded by a black array from reflecting the ambient light, and to improve a quality of the display panel.

The display panel of this embodiment further includes an array substrate 2 and a package structure 3; the sub pixel regions 10 are formed on the array substrate 2; the package structure 3 is formed on the array substrate 2; the black matrix layer 1 is formed in the package structure 3 and not limited to this structure, and the black array 3 is formed on the package structure 3 or between the package structure 3 and the array substrate 2. The package structure 3 including at least one inorganic layer (not shown) and at least one organic layer (not shown); the inorganic layer and the organic layer overlap with each other.

The array substrate 2 includes a thin film transistor structural layer 201, a plurality of first electrodes 202, a second electrode 204 and a plurality of thin film transistors. Each of the thin film transistors corresponds to one sub pixel region 10. The first electrodes 202 correspondingly formed on the thin film transistor structural layer 201 and connecting to the thin film transistors. Each of the first electrodes 202 corresponds to the light emitting region 101. A light emitting material layer 203 is correspondingly formed on the first electrodes 202 of the light emitting regions 101, and the second electrode 204 is formed on the light emitting material layer 203. The package structure 3 is formed on the second electrode 204. The first electrodes 202 are anodes, and the second electrode 202 is a cathode.

The thin film transistor structural layer 201 includes a substrate 2011 and an array layer 2012. The array layer 2012 is formed on the substrate 2011. The array layer 2012 includes switching transistors TFT1, driving transistors TFT2, compensating circuits, and a combination of one or more capacitors. The thin film transistor is an insulated gate field effect transistor. An operating state of it can be expressed by a metal oxide semiconductor field effect transistor (MOSFET) working principle of monocrystalline silicon characterized by Weimer. For example as an n-channel MOSFET, when voltage is applied to a gate electrode, an electric field is produced by gate voltage in a gate insulating layer, a power line faces a semiconductor surface from the gate electrode and generates inductive charges on the surface. With the gate voltage increasing, the semiconductor surface is changed from a depletion layer to an electron accumulation layer and forms an inversion layer. When reaching a strong inversion mode (as reaching a turn on voltage), a voltage is applied between a source electrode and a drain electrode to make current carriers through a channel. When the source and drain voltage is little, the conducting channel is similar to a constant resistance, drain current increases linearly with the increase of the source and drain voltage. When the source and drain voltage is high, it will affect the gate voltage, making the electric field of the gate insulating layer gradually decrease from the source electrode to the drain electrode, making electrons of the inversion layer of the semiconductor surface gradually decrease from the source electrode to the drain electrode, and making the channel resistance increase with the source and drain voltage increasing. An increasing speed of the drain current becomes slow corresponding a transition from a linear region to a saturation region. When the source and drain voltage increases and reaches a certain extent, a thickness of the inversion layer of the source electrode changes to zero to make the voltage increase and make the device reach a saturation region. In an actual production of light crystal displays (LCDs), a turn on mode of a-Si:HTF is used to fast charge a pixel capacitor, a turn off mode is used to maintain a voltage of the pixel capacitor to realize the unification of a quick response and a good store.

One organic layer is placed at one side of the package structure 3 facing the array substrate 2; the black matrix layer 1 is formed between the package structure 3 and array substrate 2. In this embodiment, after forming the black matrix layer 1, the package structure 3 includes an overlapping structure formed by a first organic layer 3021, a first inorganic layer 3011, a second organic layer 3022, and a second inorganic layer 3012, an organic/inorganic composite layer has a synergetic effect to improve an effect of isolating water and oxygen. Therefore, referring to FIG. 1, the black matrix layer 1 is formed between the first organic layer 3021 and the second electrode 204. Material of the black matrix layer 1 can be made of metal chromium (Cr), black resin, and etc., and not limited thereto.

The organic layer is made of an organic polymer including parylene, polypropylene, polyacrylate or a silicone crosslinked polymer SiOxCyHz, the organic layer is used to flatten defects of the inorganic layer and to decrease stress. The inorganic layer is made of inorganic materials including SiNx, SiOy, TiO2, Ta2O3, or aluminum. The inorganic layer is used to isolate water and oxygen. The organic layers and the inorganic layers can be coupled and used to form the overlapping structure, the material of organic layer is used to repair the defects of the inorganic layer, to lengthen a water oxygen permeation channel, and to improve an effect of isolating water and oxygen. On the other hand, the selection of the organic layer and the inorganic layer determines a stress, an adhesive power, and etc. between film and film to make a significant influence on stability and an anti-rubbing effect of the package structure.

Embodiment 2

Figure 2:
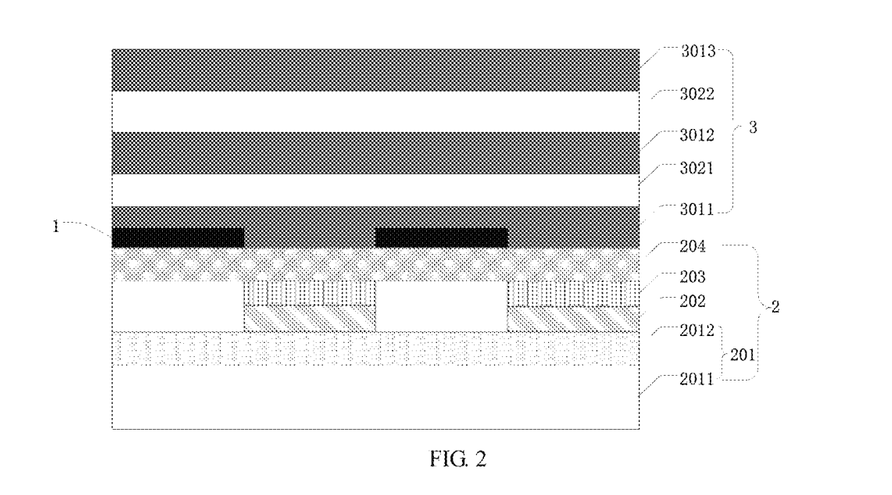
FIG. 2 is a structural view of a black matrix layer formed between a package structure and a second electrode of a second exemplary embodiment according to the present disclosure.

Referring to FIG. 2, the difference between Embodiment 2 and Embodiment 1 is that: the inorganic layer is placed at one side of the package structure 3 facing the array substrate 2; the black matrix layer 1 is formed between the package structure 4 and the array substrate. After forming the black matrix layer 1, the package structure 3 includes an overlapping structure formed by the first inorganic layer 3011, the first organic layer 3021, the second inorganic layer 3012, the second organic layer 3022 and a third inorganic layer 3013, the organic/inorganic composite layer has a synergetic effect to improve an effect of isolating water and oxygen. Therefore, referring to FIG. 2, the black matrix layer 1 is formed between the first inorganic layer 3011 and the second electrode 204.

Embodiment 3

Figure 3:
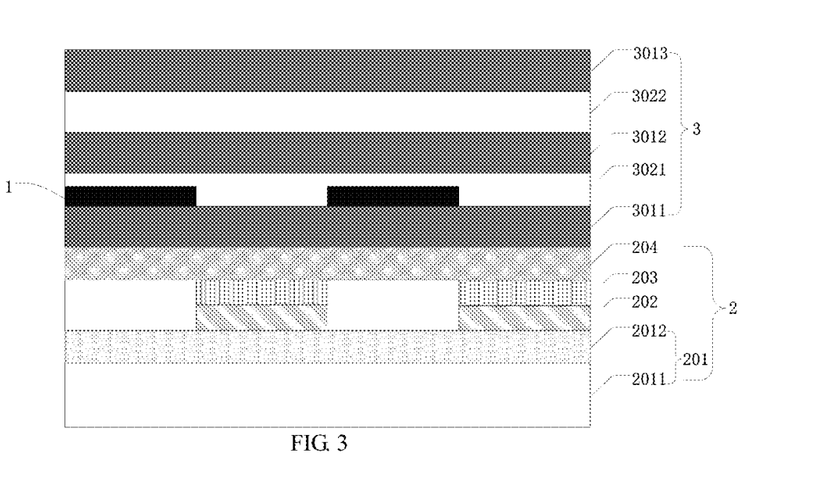
FIG. 3 is a structural view of a black matrix layer formed in a first inorganic layer of one exemplary embodiment according to the present disclosure.

Referring to FIG. 3, the difference between Embodiment 3 and Embodiments 1 and 2 is that: when the black matrix layer 1 is formed in the package structure 3, in each of the sub pixel regions 10, the black matrix layer 1 is formed in at least one inorganic layer and/or in at least one organic layer. The package structure 3 includes an overlapping structure formed by the first inorganic layer 3011, the first organic layer 3021, the second inorganic layer 3012, the second organic layer 3022, and the third inorganic layer 3013, the organic/inorganic composite layer has a synergetic effect to improve an effect of isolating water and oxygen. The black matrix layer 1 can be formed on the first inorganic layer 3011 or on the second inorganic layer 3012, and not limit thereto. Preferably, the black matrix layer 1 can be formed after the first inorganic layer 3011, then the first organic layer 3021 is formed, the organic layer can flat a portion of the black matrix layer and a portion without the black array upon the light emitting device and can fill into crackles and holes of the black array or the inorganic material layer to decrease stress diffusion.

Embodiment 4

Figure 4:
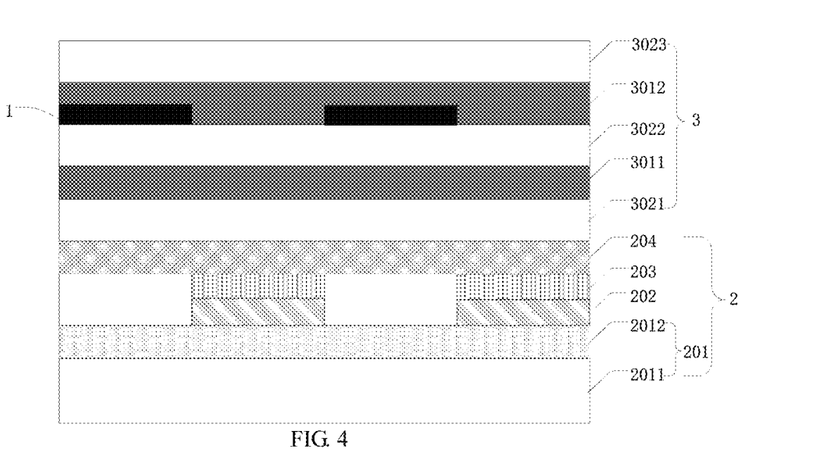
FIG. 4 is a structural view of a black matrix layer formed in a second organic layer of one exemplary embodiment according to the present disclosure.

Referring to FIG. 4, the difference between Embodiment 4 and Embodiments 1 to 2 is that: when the black matrix layer 1 is formed in the package structure 3, in each of the sub pixel regions 10, the black matrix layer 1 is formed in at least one inorganic layer and/or in at least one organic layer. The package structure 3 includes an overlapping structure formed by the first organic layer 3021, the first inorganic layer 3011, the second organic layer 3022, the second inorganic layer 3012, and the third inorganic layer 3023, the organic/inorganic composite layer has a synergetic effect to improve an effect of isolating water and oxygen. The difference between this embodiment and Embodiment 3 is that: the black matrix layer 1 is formed after the second organic layer 3022, then the second inorganic layer 3012 is formed, the organic layer can flat a portion of the black matrix layer and a portion without the black array upon the light emitting device and fill into crackles and holes of the black array or the inorganic material layer to decrease stress diffusion.

Embodiment 5

Figure 5:
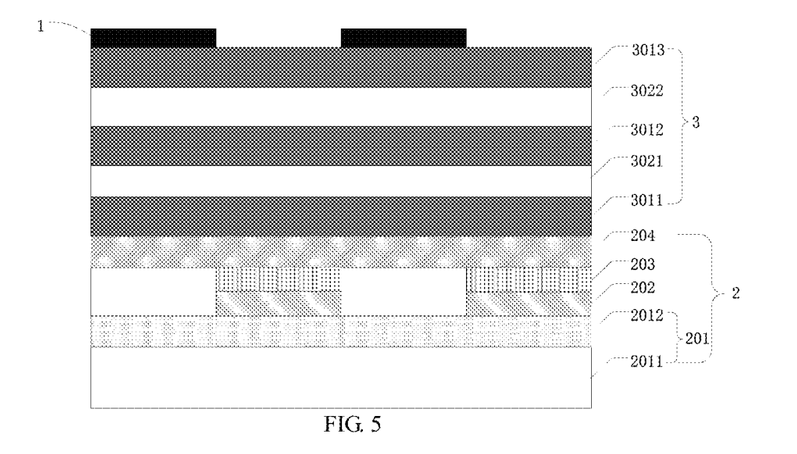
FIG. 5 is a structural view of a black matrix layer formed on a package structure of one exemplary embodiment according to the present disclosure.

Referring to FIG. 5, the difference between Embodiment 5 and Embodiments 1 to 4 is that: the inorganic layer is placed at one side of the package structure 3 defined the farthest from the array substrate 2, the package structure 3 includes an overlapping structure formed by the first inorganic layer 3011, the first organic layer 3021, the second inorganic layer 3012, the second organic layer 3022, and the third inorganic layer 3013, the organic/inorganic composite layer has a synergetic effect to improve an effect of isolating water and oxygen. Preferably, in this embodiment, when the black matrix layer 1 is formed on the package structure 3, the black matrix layer 1 is formed on the inorganic layer defined the farthest from the array substrate, shown as FIG. 5. The black matrix layer 1 is formed on the third inorganic layer 3013, and the black matrix layer 1 is used to shield a metal layer to prevent reflecting and absorbing the ambient light to improve a light output rate and to improve a contrast ratio of the display device.

Embodiment 6

Figure 6:
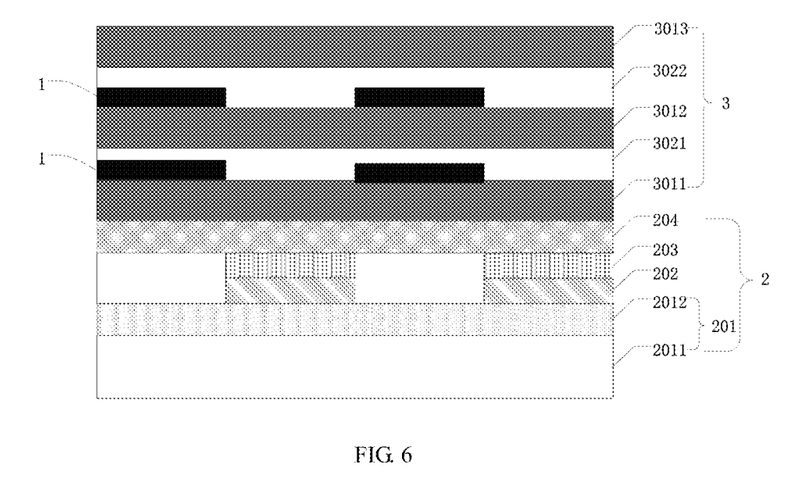
FIG. 6 is a structural view of a black matrix layer formed in the package structure of one exemplary embodiment according to the present disclosure.

Referring to FIG. 6, the difference between Embodiment 6 and Embodiments 1 to 5 is that: when the black matrix layer 1 is formed in the package structure 3, the package structure 3 includes an overlapping structure formed by the first inorganic layer 3011, the first organic layer 3021, the second inorganic layer 3012, the second organic layer 3022, and the third inorganic layer 3023, the organic/inorganic composite layer has a synergetic effect to improve an effect of isolating water and oxygen. In each of the sub pixel regions 10, the black matrix layer 3 is formed in at least one organic layer 302. When the black matrix layer 1 is formed in the first organic layer 3021 and in the second organic layer 3022, the black matrix layer 1 with a thin thickness can be easily flattened by the organic layer 302, and the multilayered black matrix layer 1 can satisfy a total thickness request of the black matrix layer for shielding and absorbing the ambient light.

Embodiment 7

Figure 7:
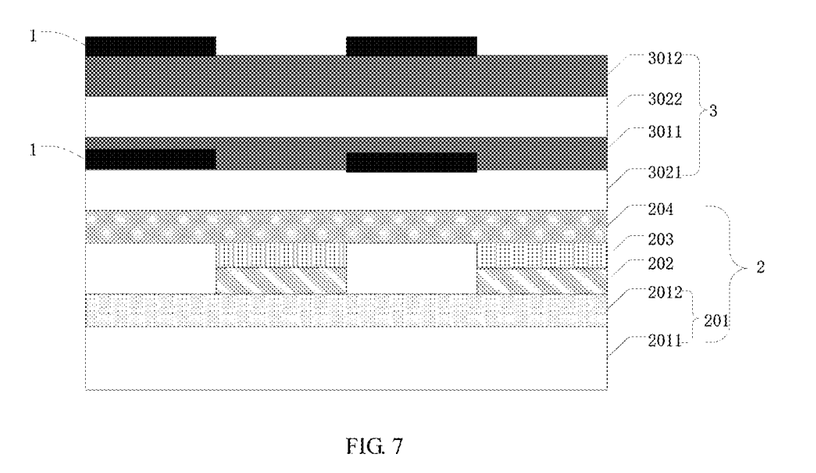
FIG. 7 is a structural view of the black matrix layer formed on and in the package structure of one exemplary embodiment according to the present disclosure.

Referring to FIG. 7, the difference between Embodiment 7 and Embodiments 1 to 6 is that: the inorganic layer is placed at one side of the package structure 3 defined the farthest from the array substrate 2, when the black matrix layer 3 is formed on the package structure 3 and in the inorganic layer or the organic layer, the black matrix layer 1 is formed on the inorganic layer defined the farthest from the array substrate.

In detail, the package structure 3 includes an overlapping structure formed by the first organic layer 3021, the first inorganic layer 3011, the second organic layer 3022, and the second inorganic layer 3012, the organic/inorganic composite layer has a synergetic effect to improve an effect of isolating water and oxygen. When the black matrix layer 1 is formed in the first organic layer 3021 and the second inorganic layer 3012, the black matrix layer 1 is formed on the second inorganic layer 3012 the farthest from the array substrate 2, the black matrix layer 1 with a thin thickness can be easily flattened by the organic layer, and the multilayered black matrix layer 1 can satisfy a total thickness request of the black matrix layer for shielding and absorbing the ambient light.

Embodiment 8

Figure 8:
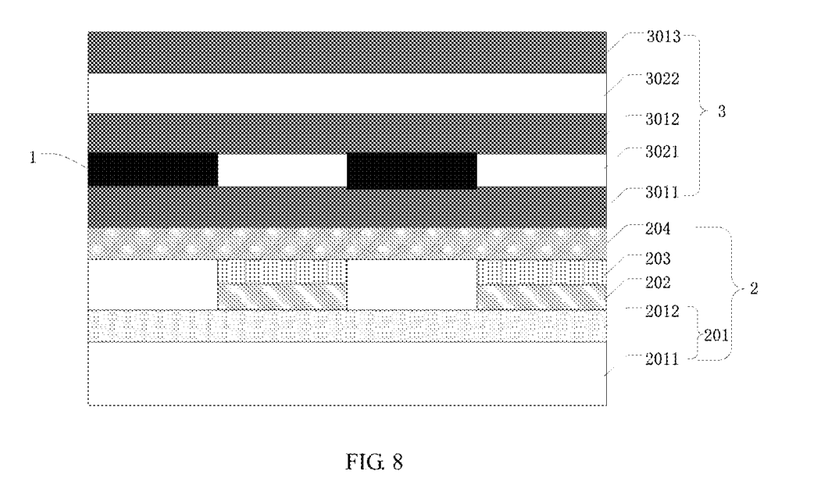
FIG. 8 is a structural view of a black array filled into gaps of an organic layer of the first exemplary embodiment according to the present disclosure.

Referring to FIG. 8, the difference between Embodiment 8 and Embodiments 1 to 7 is that: when black matrix layer 1 is formed in the organic layer, the black matrix layers correspond to the non-light emitting regions 102, the black matrix layer 1 and the organic layer are formed alternately.

In this embodiment, after the black matrix layer 1 is formed, then the organic layer is formed in gaps 200 defined in the black matrix layer 1, the organic layer having a thickness equal to or similar to a thickness of the black matrix layer 1 is formed between the black matrix layer 1 by a process such as an ink jet, and the inorganic layer is formed on the black matrix layer 1 and the organic layer.

In detail, the package structure 3 includes an overlapping structure formed by the first inorganic layer 3011, the first organic layer 3021, the second inorganic layer 3012, the second organic layer 3022, and the third inorganic layer 3023, the organic/inorganic composite layer has a synergetic effect to improve an effect of isolating water and oxygen. After the black matrix layer 1 is formed, the first organic layer 3021 having a thickness equal to or similar to a thickness of the black matrix layer 1 is formed between the black matrix layer 1 by a process such as an ink jet, and the second inorganic layer 3012 is formed on the black matrix layer 1 and the first organic layer 3021.

Embodiment 9

Figure 9:
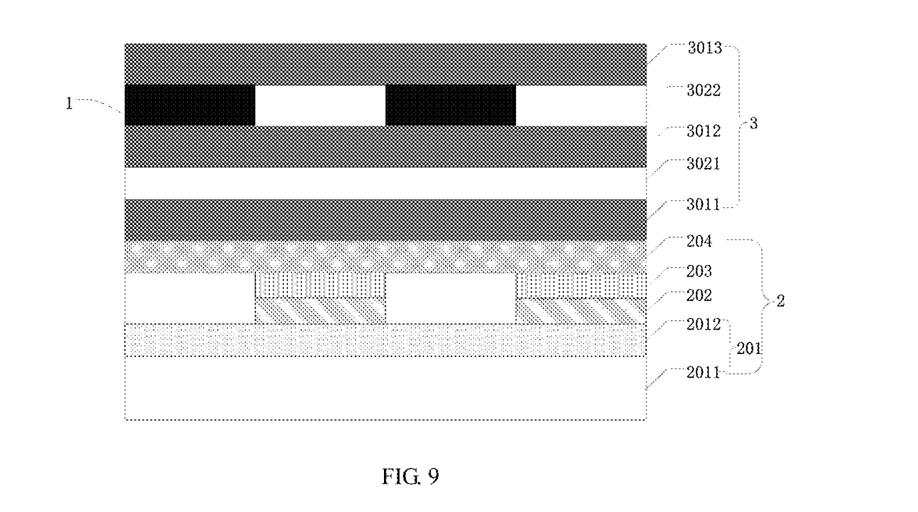
FIG. 9 is a structural view of a black array filled into gaps of an organic layer of the second exemplary embodiment according to the present disclosure.

Referring to FIG. 9, the difference between Embodiment 8 and Embodiments 1 to 7 is that: when black matrix layer 1 is formed in the organic layer, a plurality of gaps 200 corresponding to the light emitting region 101 are defined in the organic layer, the black matrix layer 1 is filled into the gaps 200.

The difference between this embodiment and Embodiment 8 is that: the organic layer is formed firstly, then the black matrix layer 1 is formed in the gaps of the organic layer, the black matrix layer 1 having a thickness equal to or similar to a thickness of the organic layer is formed between the organic layer by a process such as an ink jet, and the inorganic layer is formed on the black matrix layer 1 and the organic layer.

In detail, the package structure 3 includes an overlapping structure formed by the first inorganic layer 3011, the first organic layer 3021, the second inorganic layer 3012, the second organic layer 3022, and the third inorganic layer 3023, the organic/inorganic composite layer has a synergetic effect to improve an effect of isolating water and oxygen. After the organic layer 3022 is formed, the black matrix layer 1 having a thickness equal to or similar to a thickness of the second organic layer 3022 is formed between the second organic layer 3022 by a process such as an ink jet, and the third inorganic layer 3013 is formed on the black matrix layer 1 and the second organic layer 3022.

Figure 10:
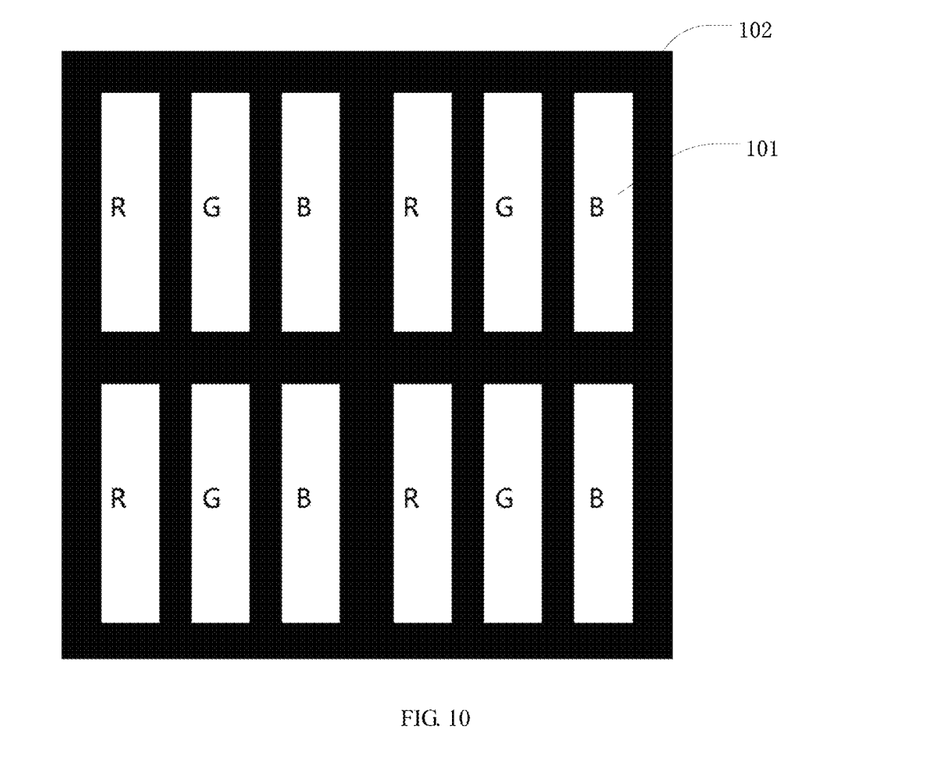
FIG. 10 is a structural view of a display panel of one exemplary embodiment according to the present disclosure.

In conclusion, FIG. 10 is a schematic diagram of the structure of the above embodiments after the black matrix layer formed, the black array is used to shield the metal layer to prevent reflecting and absorbing the environment light, to improve a light output rate and to improve a contrast ratio of the display device. In addition, the package structure of the above embodiments including an overlapping structure formed by inorganic layer, organic layer, inorganic layer, organic layer inorganic layer, the black matrix layer is correspondingly formed in the non-light emitting region. One layer or multi layers of the black matrix layer can be formed before an organic/inorganic packaging process; or one layer or multi layers of the black matrix layer can be formed after the organic/inorganic packaging process. Further, one layer or multi layers of the black matrix layer can be formed in the organic/inorganic packaging structure, and not limited thereto The embodiments of the present disclosure provide a display panel and a display device. The present disclosure has been described with preferred embodiments thereof, and it is understood that many changes and modifications to the described embodiments can be carried out without departing from the scope and the spirit of the disclosure that is intended to be limited only by the appended claims.

What is claimed is:

1. An organic light-emitting diode (OLED) display panel, comprising:
   a display region comprising a plurality of sub pixel regions arranged in an array, wherein each of the sub pixel regions comprises a light emitting region and a non-light emitting region;
   a black array layer formed in the non-light emitting regions;
   an array substrate, wherein the sub pixel regions are formed in the array substrate; and
   a package structure formed on the array substrate;
   wherein the array substrate comprises:
   a thin film transistor structural layer comprising a plurality of thin film transistors, wherein each of the thin film transistors corresponds to one sub pixel region;
   a plurality of first electrodes correspondingly formed on the thin film transistor structural layer and connecting to the thin film transistors, wherein each of the first electrodes corresponds to the light emitting region;

a light emitting material layer correspondingly formed on the first electrodes of the light emitting regions; and a second electrode formed on the light emitting material layer; and the black array layer is formed on the package structure and/or between the package structure and the array substrate.

2. The display panel of claim 1, wherein the first electrodes are anodes, and the second electrode is a cathode.

3. The display panel of claim 1, wherein the package structure comprises at least one inorganic layer and at least organic layer; the inorganic layer and the organic layer overlap with each other.

4. The display panel of claim 3, wherein the organic layer is placed at one side of the package structure facing the array substrate;

the black array layer is formed between the package structure and array substrate.

5. The display panel of claim 3, wherein the inorganic layer is placed at one side of the package structure facing the array substrate;

the black array layer is formed between the package structure and array substrate.

6. The display panel of claim 3, wherein the inorganic layer is placed at one side of the package structure defined the farthest from the array substrate, when the black array layer is formed on the package structure, the black array layer is formed on the inorganic layer defined the farthest from the array substrate.

7. An organic light-emitting diode (OLED) display panel, comprising:

a display region comprising a plurality of sub pixel regions arranged in an array, wherein each of the sub pixel regions comprises a light emitting region and a non-light emitting region;

a black array layer formed in the non-light emitting regions;

an array substrate, wherein the sub pixel regions are formed in the array substrate; and a package structure formed on the array substrate, wherein the package structure comprises at least one inorganic layer and at least organic layer; the inorganic layer and the organic layer overlap with each other;

wherein the array substrate comprises:

a thin film transistor structural layer comprising a plurality of thin film transistors, wherein each of the thin film transistors corresponds to one sub pixel region;

a plurality of first electrodes correspondingly formed on the thin film transistor structural layer and connecting to the thin film transistors, wherein each of the first electrodes corresponds to the light emitting region;

a light emitting material layer correspondingly formed on the first electrodes of the light emitting regions; and a second electrode formed on the light emitting material layer; and the black array layer is formed in the package structure, in each of the sub pixel regions, the black array layer is entirely formed in at least one organic layer of the package structure formed on the array substrate.

8. The display panel of claim 7, wherein the organic layer covers the black array layer; or the organic layer comprises a plurality of gaps formed therein and corresponding to the light emitting region, the black array layer is filled into the gaps.

9. The display panel of claim 7, wherein the first electrodes are anodes, and the second electrode is a cathode.

* * * * *

UNITED STATES PATENT AND TRADEMARK OFFICE
CERTIFICATE OF CORRECTION

PATENT NO. : 10,916,732 B2
APPLICATION NO. : 16/466305
DATED : February 9, 2021
INVENTOR(S) : Yuejun Tang and Xueyun Li Page 1 of 1

It is certified that error appears in the above-identified patent and that said Letters Patent is hereby corrected as shown below:

On the Title Page

Insert as Item (30): Foreign Application Priority Data, below item (63) at Column 1:
Chinese Patent Application No. 201811516758.5 Filing Date: 2018-12-12

Signed and Sealed this
Twenty-fourth Day of August, 2021

Drew Hirshfeld
*Performing the Functions and Duties of the*
*Under Secretary of Commerce for Intellectual Property and*
*Director of the United States Patent and Trademark Office*